United States Patent
Izawa et al.

(10) Patent No.: US 7,752,420 B2
(45) Date of Patent: Jul. 6, 2010

(54) CONFIGURATION LAYOUT NUMBER CONTROLLED ADJUSTABLE DELAYING OF CONNECTION PATH CHANGES AMONG PROCESSORS IN ARRAY TO REDUCE TRANSITION GLITCHES

(75) Inventors: Yoshitaka Izawa, Kanagawa (JP); Yoshikazu Yabe, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 99 days.

(21) Appl. No.: 12/030,619

(22) Filed: Feb. 13, 2008

(65) Prior Publication Data
US 2008/0195842 A1      Aug. 14, 2008

(30) Foreign Application Priority Data
Feb. 14, 2007   (JP) .............................. 2007-033770

(51) Int. Cl.
    G06F 15/80    (2006.01)
    G06F 1/04     (2006.01)
(52) U.S. Cl. .................... 712/15; 713/401; 713/503
(58) Field of Classification Search ........................ None
    See application file for complete search history.

(56) References Cited

U.S. PATENT DOCUMENTS 5,719,514 A * 2/1998 Sato ........................... 327/262
7,425,841 B2 * 9/2008 Schmit et al. ................ 326/38
2008/0201526 A1 * 8/2008 Yabe ........................... 711/114

FOREIGN PATENT DOCUMENTS

| JP | 2001-312481 A | 11/2001 |
|----|---------------|---------|
| JP | 2004-133781 A | 4/2004  |

* cited by examiner

Primary Examiner—Kenneth S Kim
(74) Attorney, Agent, or Firm—Sughrue Mion, PLLC

(57) ABSTRACT

Occurrence and propagation of glitches caused by changing the path layout are suppressed, thereby reducing the power consumption. An array-type processor comprises a plurality of processor elements and can change the path layout relating to data transmission/reception between the processor elements depending on clock cycle. Each processor element comprises a layout information memory 11 that stores a layout information indicating signal relating to the layout of the paths, a delay adjusting circuit 12 that adjusts the timing of a layout information indicating signal Pin outputted from the layout information memory 11 at every clock cycle, and a wiring connection circuit 13 that changes a path to at least one of the other processor elements (PE) or function unit(s) (a register file unit 14 and an arithmetic logic unit 15) based on a layout information indicating signal Pout whose timing has been adjusted.

5 Claims, 17 Drawing Sheets

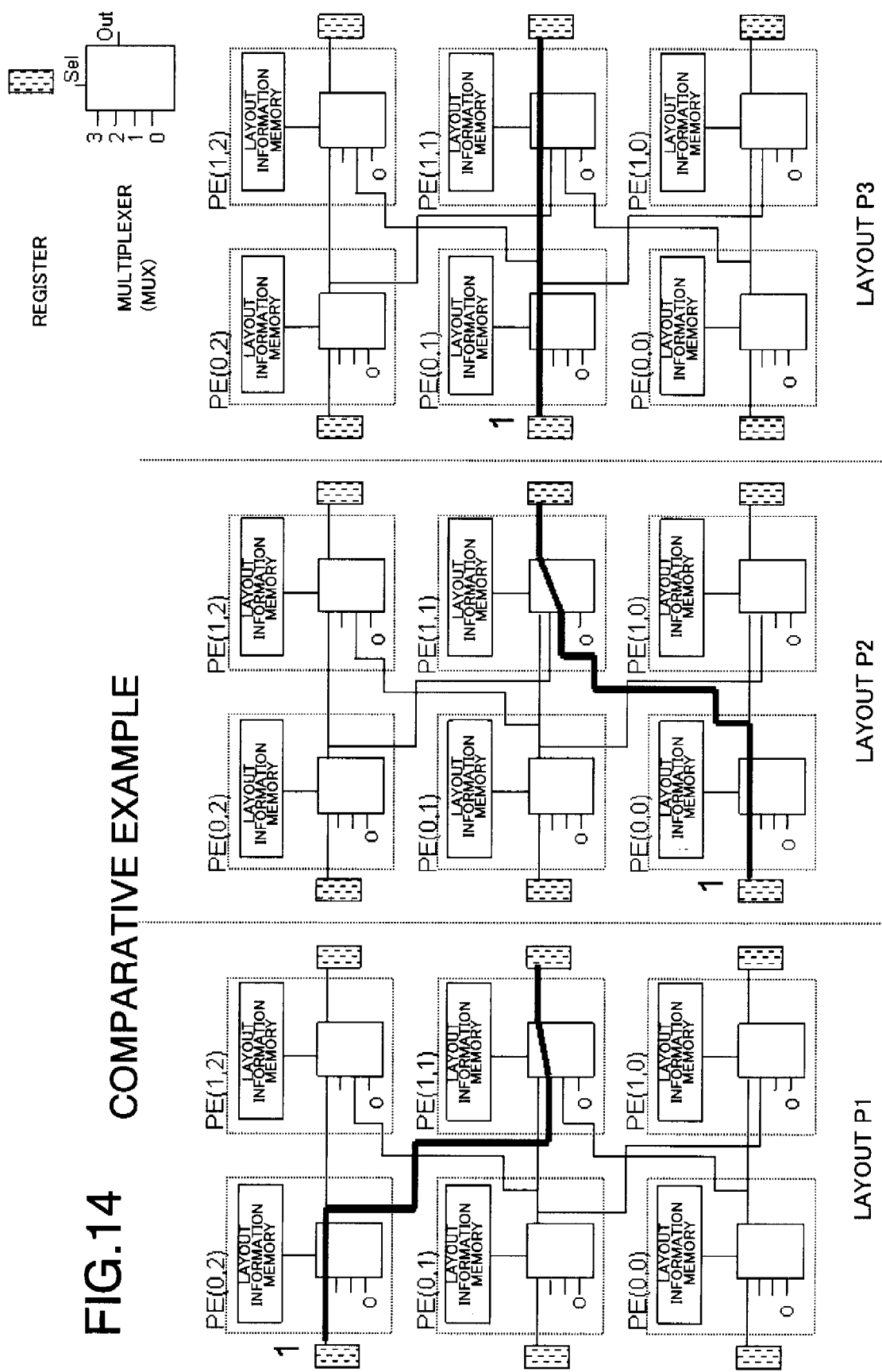
FIG.14 COMPARATIVE EXAMPLE

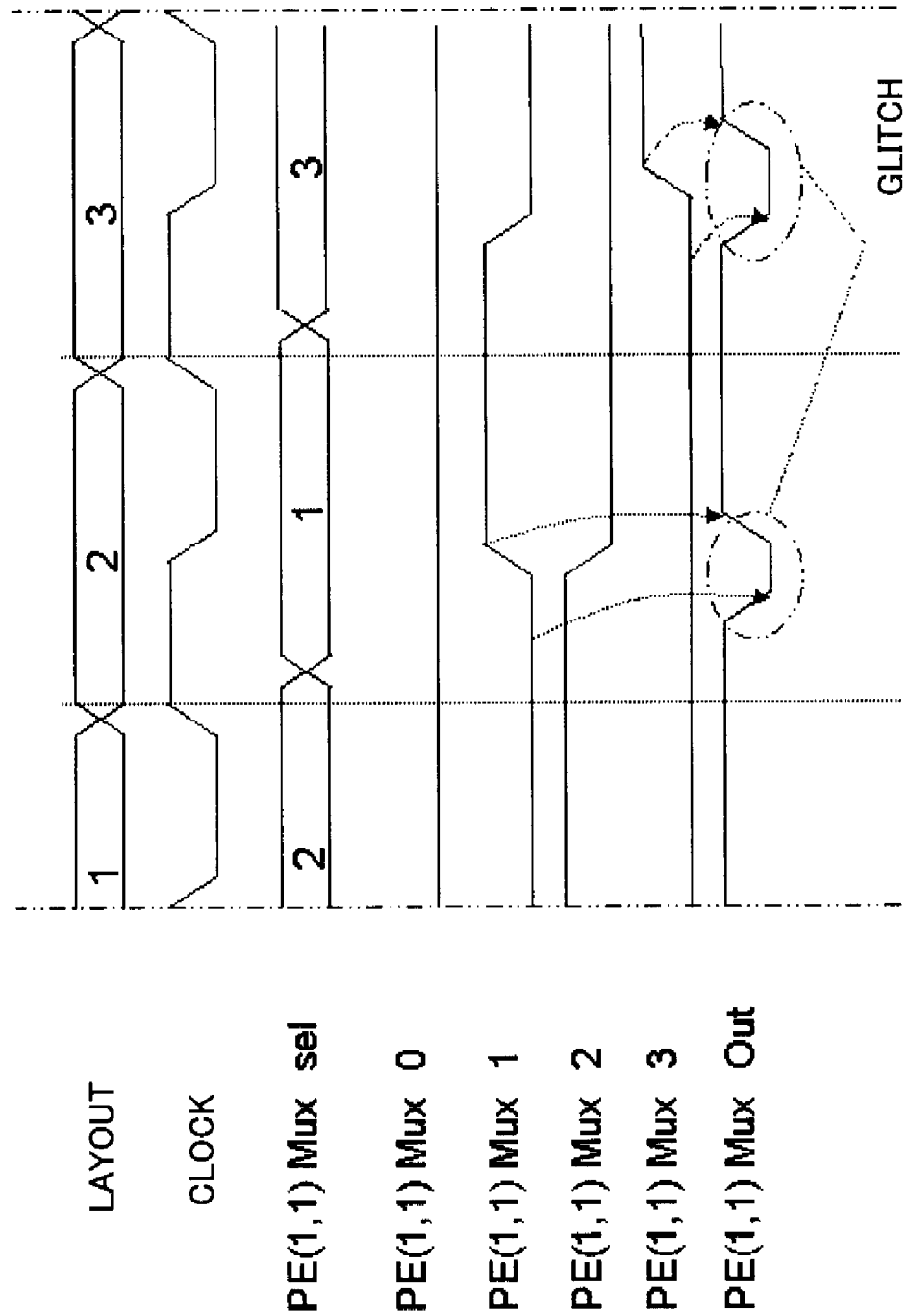

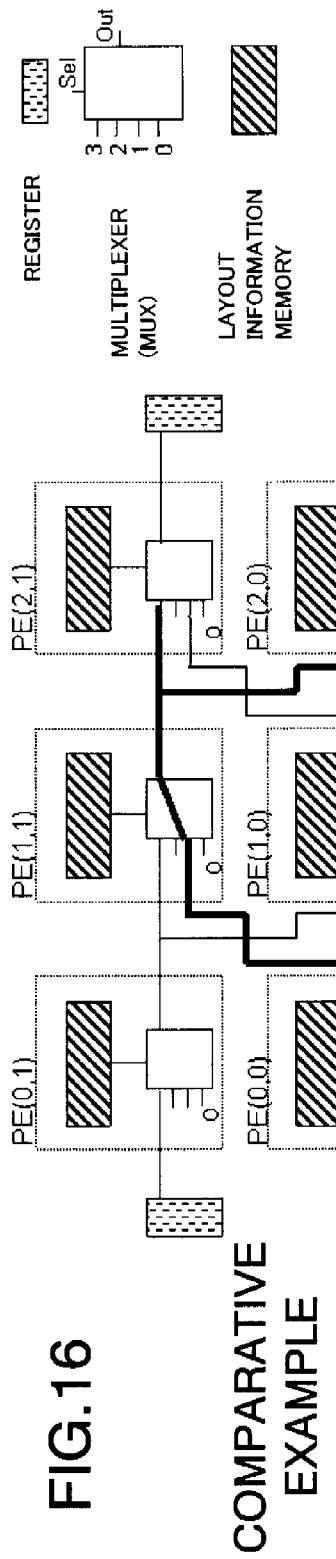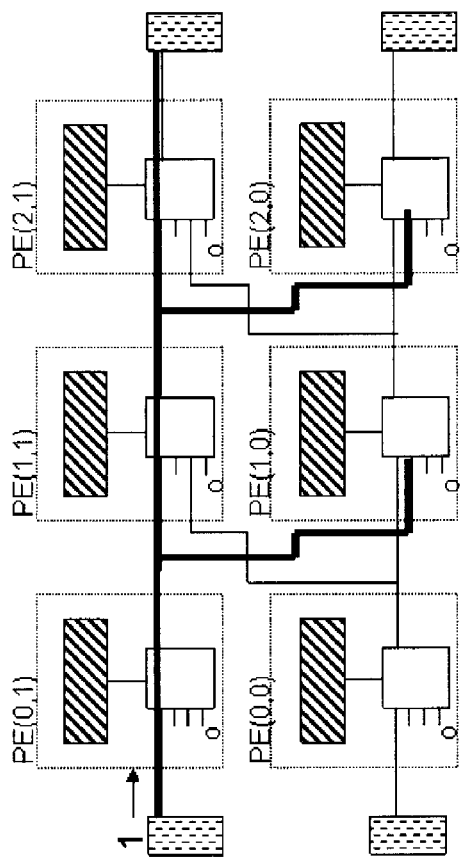
FIG.16 COMPARATIVE EXAMPLE

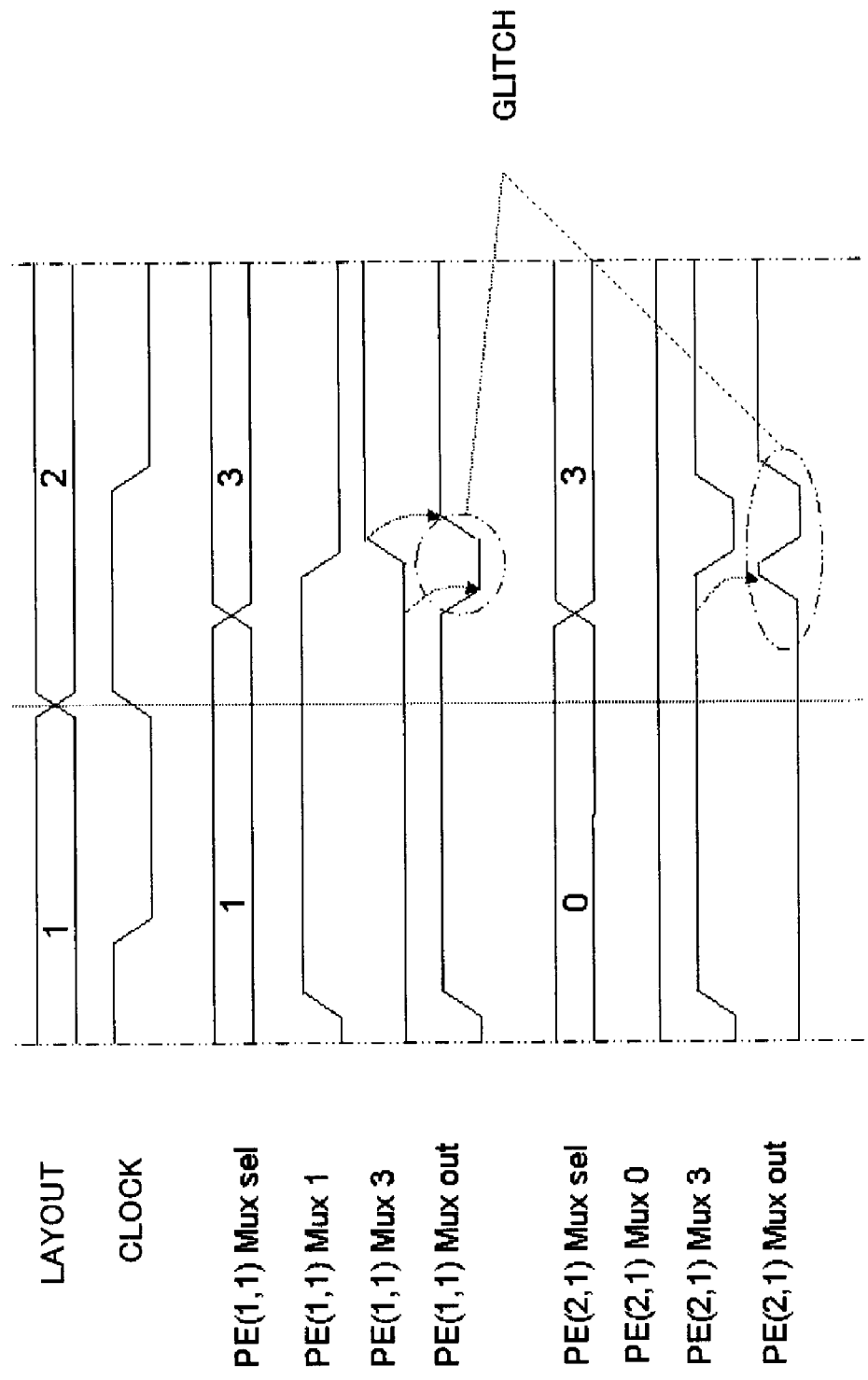
FIG.17 COMPARATIVE EXAMPLE

US 7,752,420 B2

CONFIGURATION LAYOUT NUMBER CONTROLLED ADJUSTABLE DELAYING OF CONNECTION PATH CHANGES AMONG PROCESSORS IN ARRAY TO REDUCE TRANSITION GLITCHES

REFERENCE TO RELATED APPLICATION

This application is based upon and claims the benefit of the priority of Japanese patent application No. 2007-033770, filed on Feb. 14, 2007, the disclosure of which is incorporated herein in its entirety by reference thereto.

FIELD OF THE INVENTION

The present invention relates to an array-type processor, and particularly to an array-type processor comprising a plurality of processor elements and can change the configuration of paths relating to data transmission/reception between the processor elements depending on (e.g., each) clock cycle.

BACKGROUND OF THE INVENTION

Currently, products called CPU (Central Processing Unit) and MPU (Micro-Processing Unit) are put to practical use as processor units that can easily perform various data processing tasks. In a data processing system utilizing such a processor unit, various application programs, in which a plurality of instruction codes are written, and various processing data are stored in a memory device. The processor unit sequentially reads out the instruction codes and the processing data from the memory device and performs a plurality of operations one after another. Therefore it is possible to perform various data processing tasks using one processor unit.

In data processing using such a processor unit, a plurality of operations are sequentially performed one after another. Therefore, it is difficult to perform complex data processing at high speed since the processor unit has to read out instruction codes from the memory device for each processing task.

Meanwhile, when only one type of data processing needs to be performed, a logic circuit can be realized with hardware so that it performs that particular data processing and it is not necessary for the processor unit to sequentially read out a plurality of instruction codes from the memory device and sequentially perform a plurality of operations one after another. As a result, it is possible to perform complex data processing at high speed, however, only one type of data processing can be performed.

In other words, in a data processing system where application programs can be switched, various data processing tasks can be performed, but it is difficult to perform them at high speed since the configuration of the hardware is fixed. On the other hand, it is possible to realize high speed data processing with a hardware logic circuit, but only one type of data processing can be performed since the application program cannot be changed.

In order to meet the demands of both data processing speed and program changeability, array-type processors as data processing devices in which the configuration of the hardware changes according to the software are disclosed in Patent Documents 1 and 2.

In the array-type processor of Patent Document 1 shown in FIG. 13, numerous small-scale processor elements 105, along with numerous programmable switch elements 106, are disposed in matrix in a data path section 102, and a state transition controller 101 is disposed alongside of the data path section 102. The state transition controller 101 has a state transition table memory, where a state number of a next cycle is stored, and the number is sequentially read out according to the current internal state of the state transition controller 101 and/or the conditions of an external event 209. The state number read out is converted into an instruction specifying signal (address signal) of the data path section and supplied to the data path section 102 via an operation control path 103. The plurality of the processor elements 105 individually perform data processing corresponding to instruction codes individually set in data and have the plurality of the switch elements 106 individually disposed alongside of switch-control the relationship of the electrical connection to each other.

In the array-type processor configured as described, the state transition controller 101 sequentially switches the context of the data path section 102, which is constituted by the instruction codes for the plurality of the processor elements and the plurality of the switch elements, according to a computer program at every operation cycle. Therefore, the array-type processor is capable of continuously performing parallel computing, according to the computer program.

Further, an array-type processor that can efficiently operate even in the case where a plurality of state transitions are simultaneously performed by having a plurality of state transition controllers operate in conjunction with each other is disclosed in Patent Document 2. The operation of the processor elements in this array-type processor is substantially the same as above.

[Patent Document 1]
Japanese Patent Kokai Publication No. JP-P2001-312481A

[Patent Document 2]
Japanese Patent Kokai Publication No. JP-P2004-133781A

SUMMARY OF THE DISCLOSURE

The following analyses are given by the present invention. The entire disclosures of the above mentioned patent documents are incorporated herein by reference thereto.

However, the processor elements 105 shown in FIG. 13 have tendencies that a control signal propagates fast within the processor elements, and the timing at which a data signal changes comes with a delay. In other words, since the control signal is issued from a layout information memory within the same processor element, a wiring through which the signal propagates on is short. On the other hand, since the data signal basically propagates via the plurality of the processor elements, a wiring through which the signal propagates on is long. The unbalanced signal propagations due to the length difference of the wirings may cause a glitch, an unnecessary transition in signal level. The occurrence of such a glitch may increase the consumption power of the array-type processor.

Next, how such a glitch occurs will be described using FIG. 14, as a comparative example, schematically showing the configuration of the array-type processor. In FIG. 14, the processor elements (PE) are simplified and we assume that each processor element is simply constituted by a layout information memory and a multiplexer. Further, a register is disposed outside of each processor element, and we assume that each register stores a high level (1) signal. Further, the array-type processor operates so that the wiring connection sequentially changes from layouts P1 to P3 shown in FIG. 14 for every clock. Further, the propagation delay time from the layout information memory to the output port of the multiplexer in the same processor element is shorter than the propagation delay time from the register to the output port of the multiplexer. The operation waveform of each section at this time is shown in FIG. 15.

When the wiring connection changes from the layout P1 to the layout P2, the signal that reaches the multiplexer that belongs to PE (1,1) fastest is a selection signal from the layout information memory. At this point of time (immediately before switching), input ports 2 and 3 of the multiplexer belonging to PE (1,1) are still in a signal state of the layout P1 and are "1" and "0" respectively. Therefore, the output port of the multiplexer belonging to PE (1,1) switches from "1" to "0" when the selection signal is switched. Then, since a "1" signal is transmitted from the multiplexer belonging to PE (0,0) to the input port 1, the output port changes from "0" to "1." As described, the output port changes from "1" to "0" to "1" since the selection signal has been switched, and this is a glitch, an unnecessary signal level transition that does not concern the essential processing. Further, when the wiring (path) changes from the layout P2 to the layout P3, the output port of the multiplexer belonging to PE (1,1) similarly changes from "1" to "0" to "1," resulting in a glitch.

Further, according to our analysis, the array-type processor can employ a circuit configuration with a plurality of processor elements and they are often connected in multiple stages. As a result, a glitch that has occurred in the preceding stage propagates to the following stages, causing multiple glitches to occur and further increasing the power consumption.

In order to show such an example, the operation of a circuit shown in FIG. 16 will be described as a comparative example. As is in the circuit in FIG. 14, each processor element is constituted by a layout information memory and a multiplexer in this circuit. Further, registers are disposed outside of processor elements, and assume that all the registers store a high level (1) signal. The circuit operates so that the wiring connection sequentially changes from layouts Q1 to Q2 for every clock. The operation waveforms at this time are shown in FIG. 17. Further, the delay time from the layout information memory to the output port of the multiplexer in the same processor element is shorter than the delay time from the register to the output port of the multiplexer.

In the circuit shown in FIG. 16, when the wiring connection changes from the layout Q1 to the layout Q2, the signal that reaches the multiplexer that belongs to PE (1,1) fastest is a selection signal transmitted from the program memory. At this point of time, input ports 1 and 3 of the multiplexer belonging to PE (1,1) are still in a signal state of the layout Q1 and are "1" and "0" respectively. Therefore, as shown in FIG. 17, the output port of the multiplexer belonging to PE (1,1) switches from "1" to "0" when the selection signal is switched. Then, since a "1" signal is transmitted from the multiplexer belonging to PE (0,1) to the input port 3 of the multiplexer belonging to PE (1,1), the output port changes from "0" to "1." As described, the output port of the multiplexer belonging to PE (1,1) changes from "1" to "0" to "1" since the selection signal has been switched, causing a glitch to occur. The signal that reaches the multiplexer belonging to PE (2,1) in the next stage fastest is also the selection signal transmitted from the program memory.

At this point of time, input ports 0 and 3 are still in a signal state of the layout Q1 and the signal state of the input port 0 is "0" and the signal sate of the input port 3 is "1." Therefore, as shown in FIG. 17, the output port switches from "0" to "1" when the selection signal is switched. Then, since the glitch occurred in the multiplexer belonging to PE (1,1) in the preceding stage propagates to the output port of the multiplexer belonging to PE (2,1), the output port changes from "0" to "1" to "0" to "1," resulting in a glitch. As described, in a multiple-stage configuration, a plurality of glitches (a plurality of transitions) occur, further increasing the power consumption.

Accordingly, there is much to be desired in the art.

According to an aspect of the present invention there is provided an array-type processor, which comprises a plurality of processor elements and is capable of changing the layout of paths, termed "path layout" hereinafter, relating to data transmission/reception between the processor elements depending on clock cycle (, particularly each clock cycle). Each of the plurality of the processor elements is configured so that the timing of changing a path (or paths) to at least one of the other processor elements can be changed based on the layout information of paths.

The meritorious effects of the present invention are summarized as follows.

According to the present invention, by changing the timing of changing paths to the other processor elements based on the layout information of the paths, the occurrence and propagation of glitches caused by changing the path layout can be suppressed, thereby reducing the power consumption.

BRIEF DESCRIPTION OF THE DRAWINGS

FIG. 14 is a first drawing showing layout changes in a comparative example of an array-type processor.

FIG. 15 is a timing chart of each section during the layout changes shown in FIG. 14.

FIG. 16 is a second drawing showing a layout change in a comparative example for an array-type processor.

FIG. 17 is a timing chart of each section during the layout change shown in FIG. 16.

PREFERRED MODES OF THE INVENTION

Figure 1:
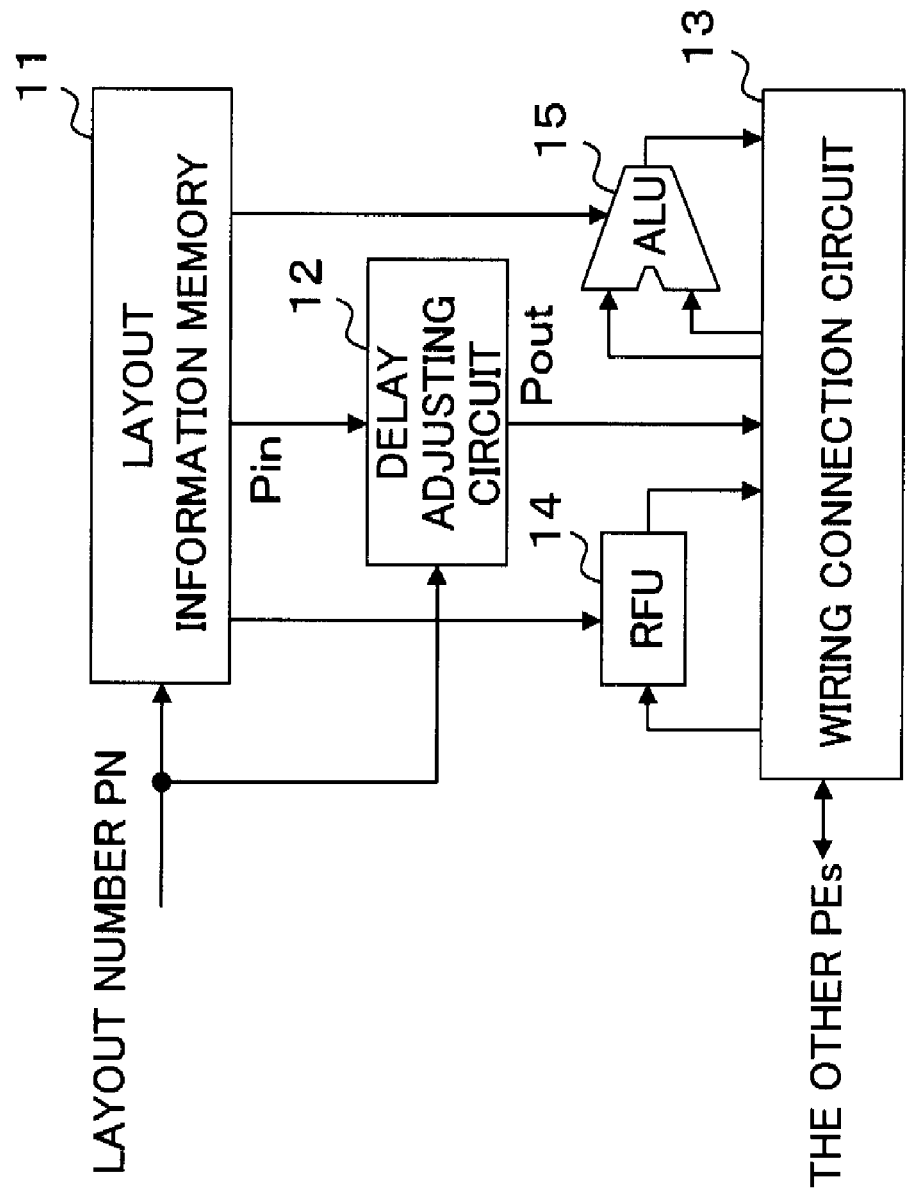
FIG. 1 is a block diagram showing the configuration of a processor element relating to a first example of the present invention.

The following modes are preferred.

Each of the plurality of the processor elements may comprise:

a function unit that performs an operation;

a memory that stores a layout information indicating signal relating to the path layout;

a wiring connection circuit that changes the connection(s) to the other processor element(s) or to the function unit(s) based on a layout information indicating signal outputted from the memory at every clock cycle; and a delay adjusting circuit that adjusts the timing of a connection change by the wiring connection circuit at every clock cycle.

The delay adjusting circuit may comprise:

a plurality of delay circuits, having delay times different from each other, that delay a layout information indicating signal outputted from the memory at every clock cycle;

a first selection circuit that outputs a layout information indicating signal, whose timing has been adjusted, by selecting one of the plurality of the delay circuits to the wiring connection circuit; and a first register group that holds the selection information of the delay circuit regarding the first selection circuit; and the first selection circuit selects one of the plurality of the delay circuits according to selection information outputted from the first register group based on a layout number indicating a path layout.

The wiring connection circuit may comprise:

a path selection circuit that selects a path to at least one of the other processor elements or to at least one function unit according to a layout information indicating signal outputted from the memory at every clock cycle; and a plurality of latch circuits that hold a signal of a path selected with a latch permission signal when the path is selected by the path selection circuit; and the delay adjusting circuit comprises:

a first register group that stores data for selecting one of the plurality of the latch circuits;

a first selection circuit that selects data in the first register group according to a layout number indicating a path layout given at every clock cycle and outputs the data;

a plurality of delay circuits, having delay times different from each other, that delay a signal outputted from the first selection circuit;

a second register group that stores data for selecting a delay time of the delay circuits;

a second selection circuit that selects data in the second register group according to the layout number and outputs the data; and a third selection circuit that selects one of the plurality of the delay circuits according to an output signal of the second selection circuit and outputs an output signal of the delay circuit, whose timing has been adjusted, as the latch permission signal.

An array-type processor relating to an example of the present invention comprises a plurality of processor elements and is capable of changing the configuration (or routing) of paths relating to data transmission/reception between the processor elements for each clock cycle. Each of the plurality of the processor elements is capable of changing the timing of changing the paths (routing) to at least one of the other processor elements based on the layout information of the paths (i.e., path layout information).

More concretely, each of the plurality of the processor elements may comprise function units (14 and 15 in FIG. 1) that perform an operation, a memory (11 in FIG. 1) that stores a layout information indicating signal relating to the layout of the paths (i.e., path layout), a wiring connection (or routing) circuit (13 in FIG. 1) that changes the connections (routing) to the other processor element(s) or to the function unit(s) based on the layout information indicating signal (Pin in FIG. 1) outputted from the memory at every clock cycle, and a delay adjusting circuit (15 in FIG. 1) that adjusts the timing of the connection change by the wiring connection circuit at every clock cycle.

Further, the delay adjusting circuit may comprise a plurality of delay circuits (24a, 24b, 24c, and 24d in FIG. 3), having delay times different from each other, that delay the layout information indicating signal outputted from the memory at every clock cycle, a first selection circuit (23 in FIG. 3) that outputs the layout information indicating signal (Pout in FIG. 3), whose timing has been adjusted, by selecting one of the plurality of the delay circuits to the wiring connection circuit, and a first register group (21 in FIG. 3) that holds the selection information of the first selection circuit regarding the delay circuit, and the first selection circuit may select one of the plurality of the delay circuits according to the selection information outputted from the first register group based on a layout (or routing) signal (Pn in FIG. 3) indicating a path layout.

Further, the wiring connection circuit may comprise a path selection circuit (32 in FIG. 7) that selects a path to at least one of the other processor elements or to the function unit(s) according to the layout information indicating signal outputted from the memory at every clock cycle, and a plurality of latch circuits (31 in FIG. 7) that hold a signal of the path selected with a latch permission signal when the path is selected by the path selection circuit, and the delay adjusting circuit (12a in FIG. 7) may comprise a first register group (21a in FIG. 8) that stores data for selecting one of the plurality of the latch circuits, a first selection circuit (22a in FIG. 8) that selects data in the first register group according to a layout number indicating a path layout given at every clock cycle and outputs the data, a plurality of delay circuits (24a, 24b, and 24c in FIG. 8), having delay times different from each other, that delay a signal outputted from the first selection circuit, a second register group (21b in FIG. 8) that stores data for selecting the delay time of the delay circuits, a second selection circuit (22b in FIG. 8) that selects data in the second register group according to the layout number and outputs the data, and a third selection circuit (23 in FIG. 8) that selects one of the plurality of the delay circuits according to an output signal of the second selection circuit and outputs an output signal of the delay circuit, whose timing has been adjusted, as a latch permission signal.

In the array-type processor configured as above, the occurrence and propagation of glitches caused by changing the path layout (or routing) can be suppressed by adjusting the timing of the connection to the other processor elements according to the layout of the paths. As a result, the power consumption that could have increased due to the glitches can be reduced. Examples of the present invention will be described in detail with reference to the drawings.

Example 1

Figure 13:
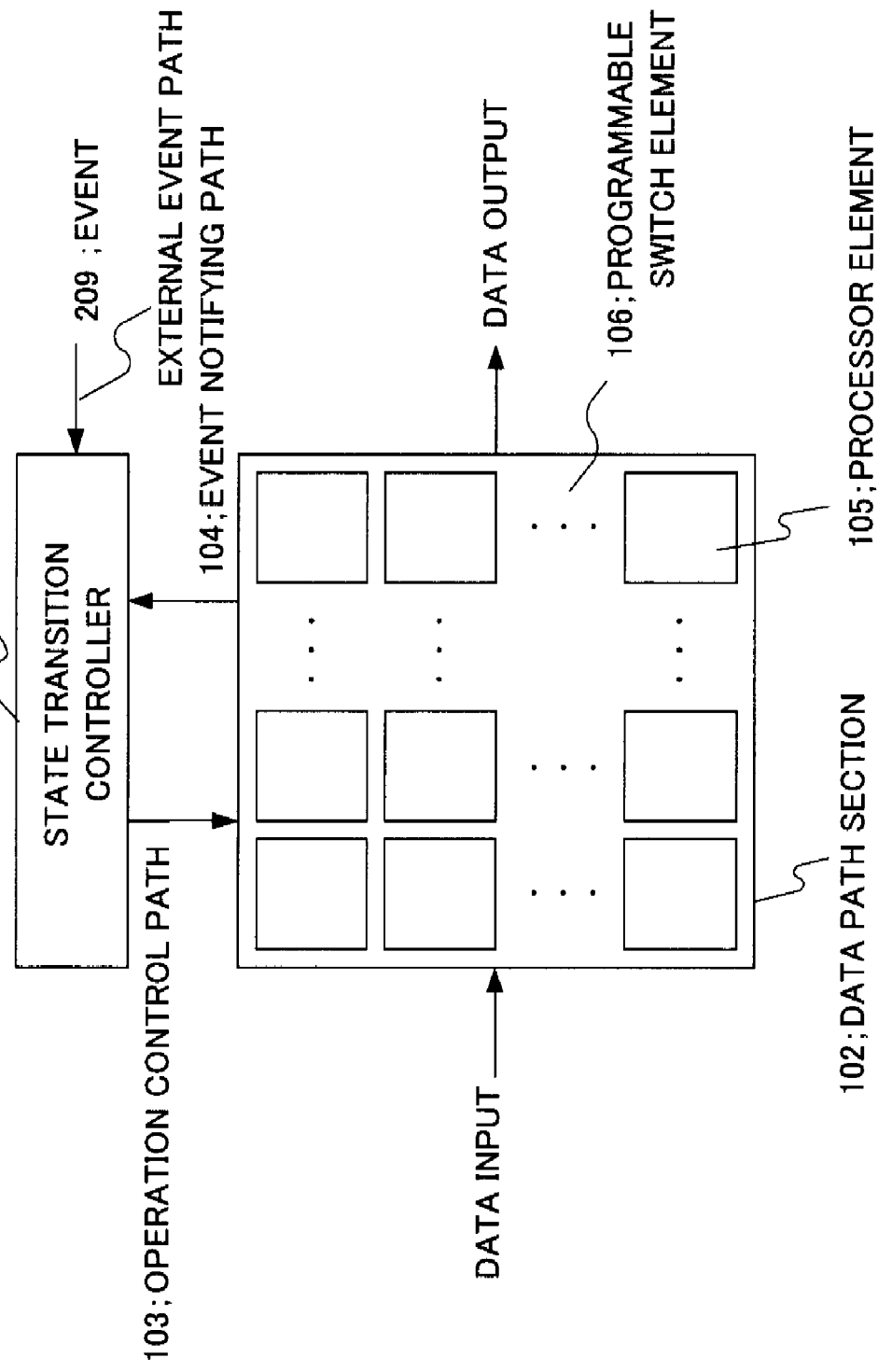
FIG. 13 is a block diagram showing the configuration of a conventional array-type processor.

The general configuration of an array-type processor relating to a first example of the present invention is the same as that of the conventional array-type processor shown in FIG. 13. In order to facilitate the description of the invention of the present application, in each of the following examples, we herewith provide that the "conventional array-type processor" in FIG. 13 is further configured as follows.

First, each of the processor elements 105 has a switch element 106, shown in the data path section 102 in FIG. 13, built in as a wiring connection circuit 13, described later. Further, in the conventional array-type processor in Patent Document 1 (the entire disclosure thereof being incorporated herein by reference thereto), the state transition table memory stores the state number, and the state transition controller 101 changes this state number and issues a layout information address of the data path section corresponding to this state number and a instruction code address of each processor element. Here, the layout information address specifies an address in the layout information memory and the layout information corresponding to the address is issued from the layout information memory. Further, the instruction code address specifies an address in the instruction memory and the instruction code corresponding to the address is issued from the instruction memory. The processing is performed by having the layout information and the instruction code change (or conduct a transition of) the circuit configuration of the data path section 102 and the instruction that each processor element follows.

In the following examples, the layout information of the data path section corresponding to the layout information address and the instruction code of each processor element corresponding to the instruction code address are both stored in a layout information memory 11. Further, the layout information stored in the layout information memory 11 includes the instruction code in the present invention.

In the present description, the layout information of the data path section and the instruction code of each processor element are controlled together by one address, and this address is called "layout number" hereinafter.

In the array-type processor of the present invention, the state transition controller 101 outputs the layout number stored in the state transition table memory built into the state transition controller 101 at every (operation) cycle, the data path section 102 reads out the layout information of the data path section 102, in the layout information memory 11, that corresponds to this layout number and the instruction that each processor element executes, and the processing is performed after changing (or conducting a transition of) the circuit configuration of the data path section 102 and the instruction that each processor element executes.

In the array-type processor of the present invention, the circuit configuration of the data path section 102 changes corresponding to the layout number, and this is realized by having a switch processor (the wiring connection circuit 13) switch the configuration (routing) of the paths between sequential circuits inside the data path section. In other words, combination circuits, which are the paths between the sequential circuits, change the configuration. For instance, only one ALU may exist between the sequential circuits or two or more ALUs may be connected so that a more complex operation can be performed. This is realized by changing the layout number.

It should be noted that, as in the conventional example, the switch elements and the processor elements may be separated, separate layout numbers that respectively specify the instruction memory address and the layout information address of the data path section may be provided, and the instruction memory and the layout information memory may be controlled separately.

As described above, the array-type processor of the present invention is constituted by the data path section 102 and the state transition controller 101 that controls the data path section 102. The data path section 102 is constituted by a plurality of the processor elements (PE) 105 disposed in array. The state transition controller 101 has the state transition table memory that stores the layout number for the next cycle. The layout numbers are sequentially read out according to the current internal state of the state transition controller 101 or the conditions of an external event signal, and are supplied to the data path section 102 via the operation control path 103. Here, the "event" means interruption and conditional branch instruction. In other words, the state transition controller normally outputs the layout numbers in the order in which they are stored, however, the output order of the layout numbers is changed when an event is received. Further, the configuration of the processor element relating to the first example differs from the conventional example in the following points. The processor element will be described in detail.

FIG. 1 is a block diagram showing the configuration of the processor element relating to the first example of the present invention. The processor element shown in FIG. 1 comprises a layout information memory 11, a delay adjusting circuit 12, function units made up of a register file unit (RFU) 14 and an arithmetic logic unit (ALU) 15, and the wiring connection circuit (routing) 13 that switches the connection of the function units and the connection to the other processor elements.

The layout information memory 11 stores multiple pieces of the layout information, and the layout information Pin is read out with the layout number Pn outputted from the state transition controller (101 in FIG. 13) as the address. Further, according to the layout information stored, the register file unit (RFU) 14 and the arithmetic logic unit (ALU) 15 operate and a desired operation is performed. In other words, the connection relationship of the register file unit (RFU) 14 and the arithmetic logic unit (ALU) 15 is reconfigured (the circuit configuration is changed) according to the information of the layout information Pin, and an instruction is executed according to the instruction code included in the layout information Pin. When the circuit configuration is changed, the configuration of the combination circuits between the registers (sequential circuits) is changed as described above. For instance, the number of ALUs in the paths between the sequential circuits becomes variable.

Based on the layout number Pn, the delay adjusting circuit 12 delays the layout information Pin read out and outputs the result to the wiring connection circuit 13 as a layout information Pout.

The operations of the function units and the wiring connection circuit 13 are determined by the layout information Pout. The wiring connection circuit 13 comprises four multiplexers 25a, 25b, 25c, and 25d as shown in a configuration example in FIG. 2 and has the functions of switching the connections of the function units in individual processor element and the connections to the other processor elements disposed above, below, left and right, corresponding to the layout information Pout. In a state in which the wiring is not connected, these multiplexers select a fixed value (0 in the example of FIG. 2) to avoid signal propagation from the other wiring.

In each processor element, the layout information Pin corresponding to the layout number Pn is read out from the layout information memory 11 and the functions of the function units and the connections made by the wiring connection circuit 13 are determined. Since the data paths configured throughout the array are determined according to the layout information, data paths as many as the number of pieces of the layout information that the layout information memory 11 is capable of storing can be configured. Since the layout information is read out using the layout number Pn, the configuration of the data paths can be changed by controlling the layout number Pn.

The layout information is created as follows. Processing to be executed is divided into a plurality of processing tasks, and each processing task is mapped separately onto the array. At this time, the tasks are mapped utilizing all the operation resources and the wiring resources of the data path section. Needless to say, the divided processing tasks cannot be executed simultaneously by the data path section, however, the state transition controller switches the mapping of the data paths at every cycle and sequentially executes the divided processing. The state transition controller stores information for performing the switch control of the data paths.

Figure 3:
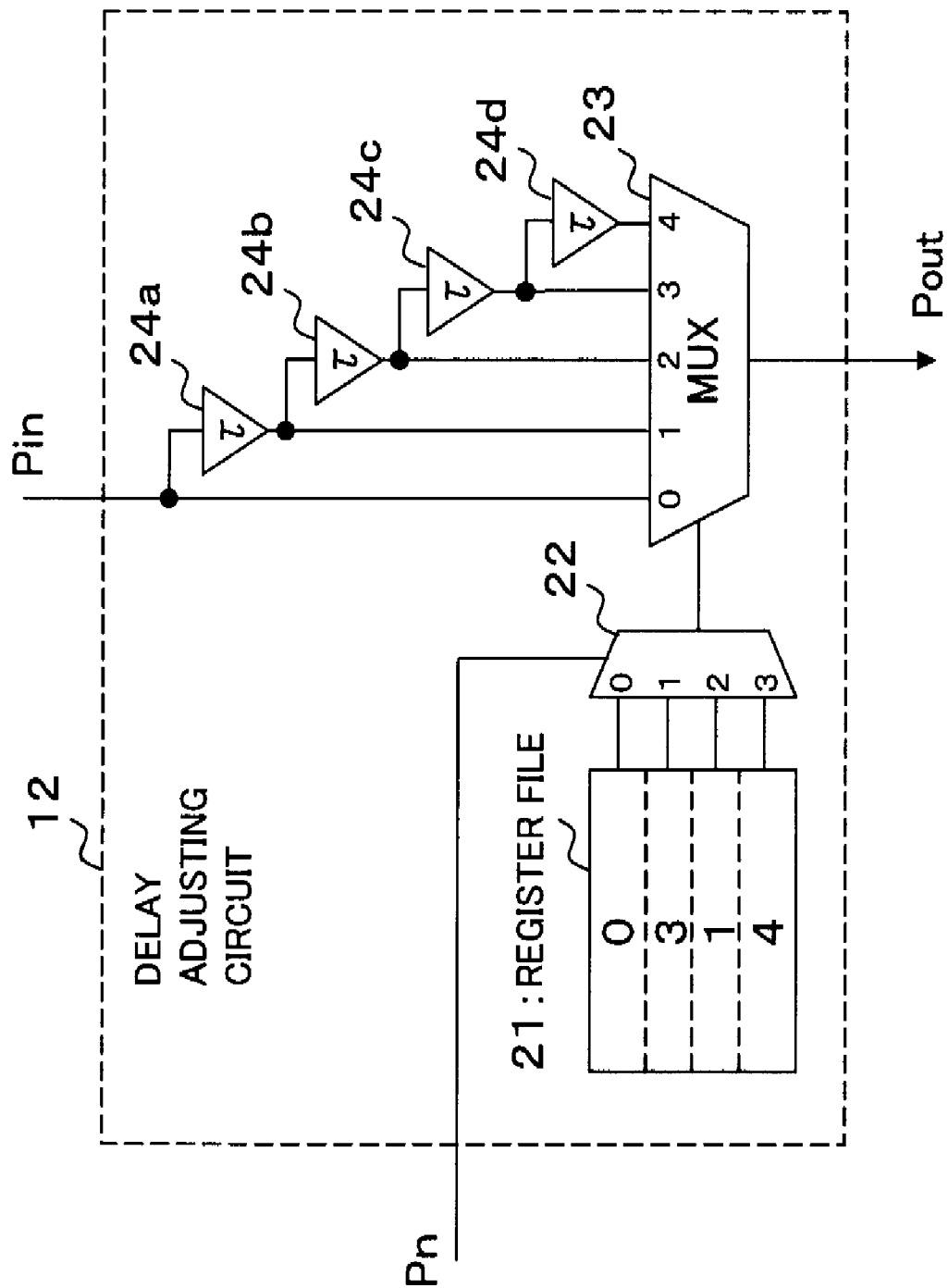
FIG. 3 is a block diagram showing the configuration of a delay adjusting circuit relating to the first example of the present invention.

Next, the delay adjusting circuit 12 will be described. FIG. 3 is a block diagram showing the configuration of the delay adjusting circuit relating to the first example of the present invention. In FIG. 3, the delay adjusting circuit 12 comprises a register file 21, multiplexers 22 and 23, and delay elements 24a, 24b, 24c, and 24d. In the register file 21, data for delay adjustment (delay adjustment data) based on a data arriving time measured using STA (Static Timing Analysis) is stored in advance. The multiplexer 22 selects one of the data stored in the register file 21 corresponding to the layout number Pn and gives it to the multiplexer 23 as a selection information for the multiplexer 23. The multiplexer 23 selects the layout information Pin or one of outputs of the delay elements 24a, 24b, 24c, and 24d connected to the layout information Pin in series based on the data in the register file 21 and outputs it to the wiring connection circuit 13 as the layout information Pout. In other words, the multiplexer 23 that selects the delay path is controlled using the data stored in the register file 21, and the delay time of the instruction issuance by the program memory is adjusted. Further, the address of the register file 21 corresponds to the circuit configuration (the connections between the processor elements) and the delay time is adjusted for every circuit configuration.

In the delay adjusting circuit 12 configured as above, when it is necessary to have small differences of the delay time, the number of choices for delay times for adjustment can be increased by connecting buffers with short delay times in multiple stages and providing many choices for the multiplexer 23. Note that, if too many choices for delay times are provided, the circuit amount of the register file will increase due to the increase in the number of the delay buffers, the increase in the circuit amount of the multiplexers, and the increase in the number of bits that need to be controlled. Therefore, it is preferable that an appropriate number of choices be provided.

First, the state transition controller (101 in FIG. 13) issues the layout number Pn, which is supplied to the layout information memory 11 and the delay adjusting circuit 12. The delay adjusting circuit 12 reads out the data that corresponds to the specified layout number Pn in the register file 21 at the next clock timing and has the multiplexer 23 select the delay path. The layout information memory 11 outputs the layout information Pin that corresponds to the specified layout number Pn at the same clock timing as well. The outputted layout information Pin is fed to the delay adjusting circuit 12 and is further outputted to the wiring connection circuit 13 via the delay path of the delay circuit selected based on the data in the register file 21.

Figure 4:
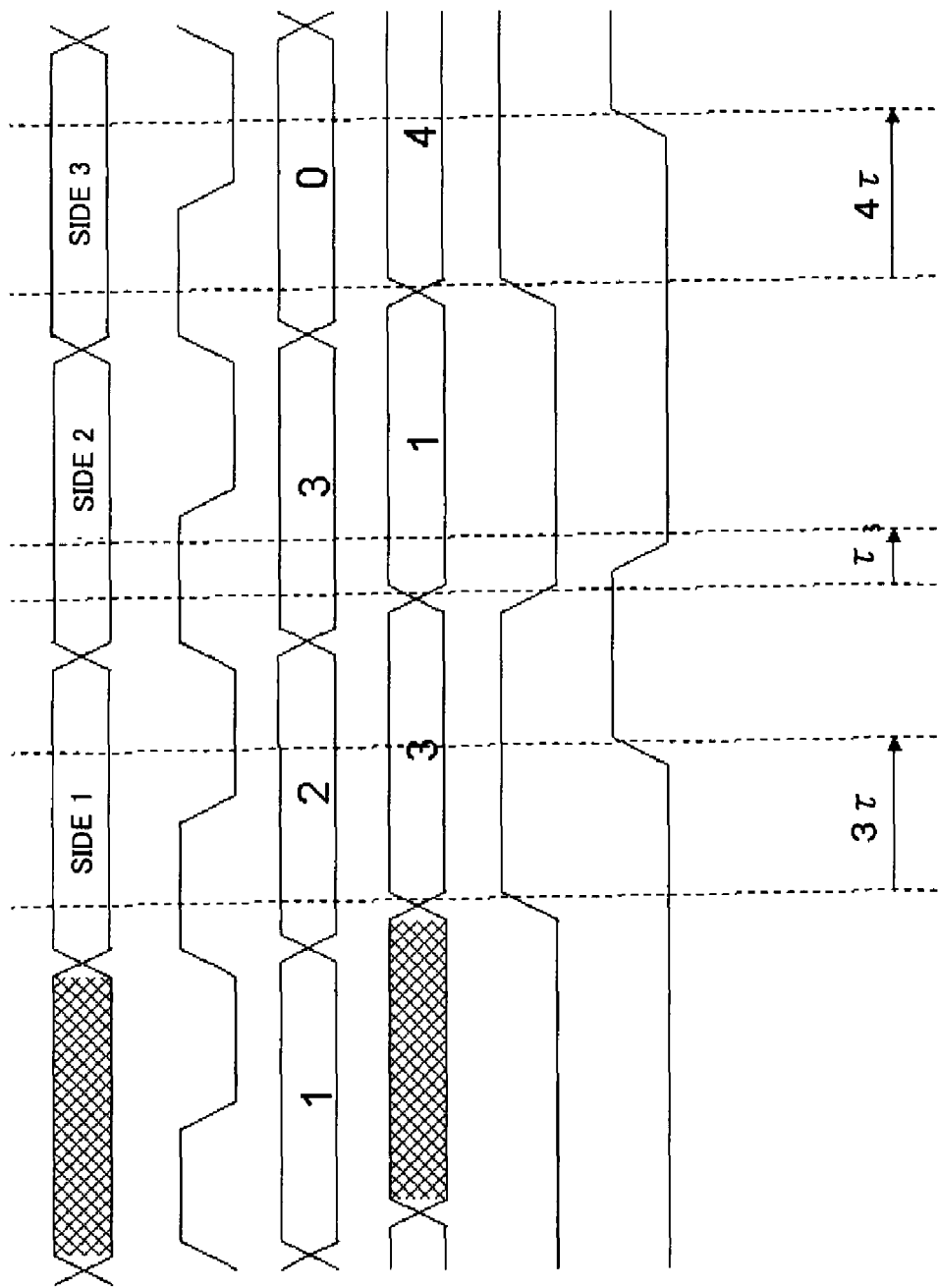
FIG. 4 is a timing chart showing examples of operation waveforms in the delay adjusting circuit when layout numbers Pn are sequentially issued.

FIG. 4 is a timing chart showing examples of operation waveforms in the delay adjusting circuit 12 when the layout numbers Pn 1 to 3 are sequentially issued. In this example, the delay adjusting circuit 12 is configured as shown in FIG. 3. The register file 21 has, for instance, four addresses, and the following five paths are provided: a path with no delay adjustment, and paths with a delay of $\tau$ (for instance $\tau=1$ ns), $2\tau$, $3\tau$, and $4\tau$. One of the paths is selected by the selection signal of the multiplexer (Mux).

Next, an example in which a glitch is suppressed in the array-type processor having the delay adjusting circuit 12 will be described using a circuit shown in FIG. 5. This circuit has a register (that corresponds to the delay adjusting circuit) added to each processor element, compared with the circuit shown in FIG. 16 as a comparative example of the array-type processor, but the operation is the same. The operation waveforms at this time are shown in FIG. 6. The time required for the data signal to arrive at each multiplexer is derived using STA (Static Timing Analysis), and the register file 21 in the delay adjusting circuit is programmed in advance so that the time required for the selection signal to arrive at each multiplexer from the layout information memory is longer than the time required for the data signal to arrive at each multiplexer.

Figure 5:
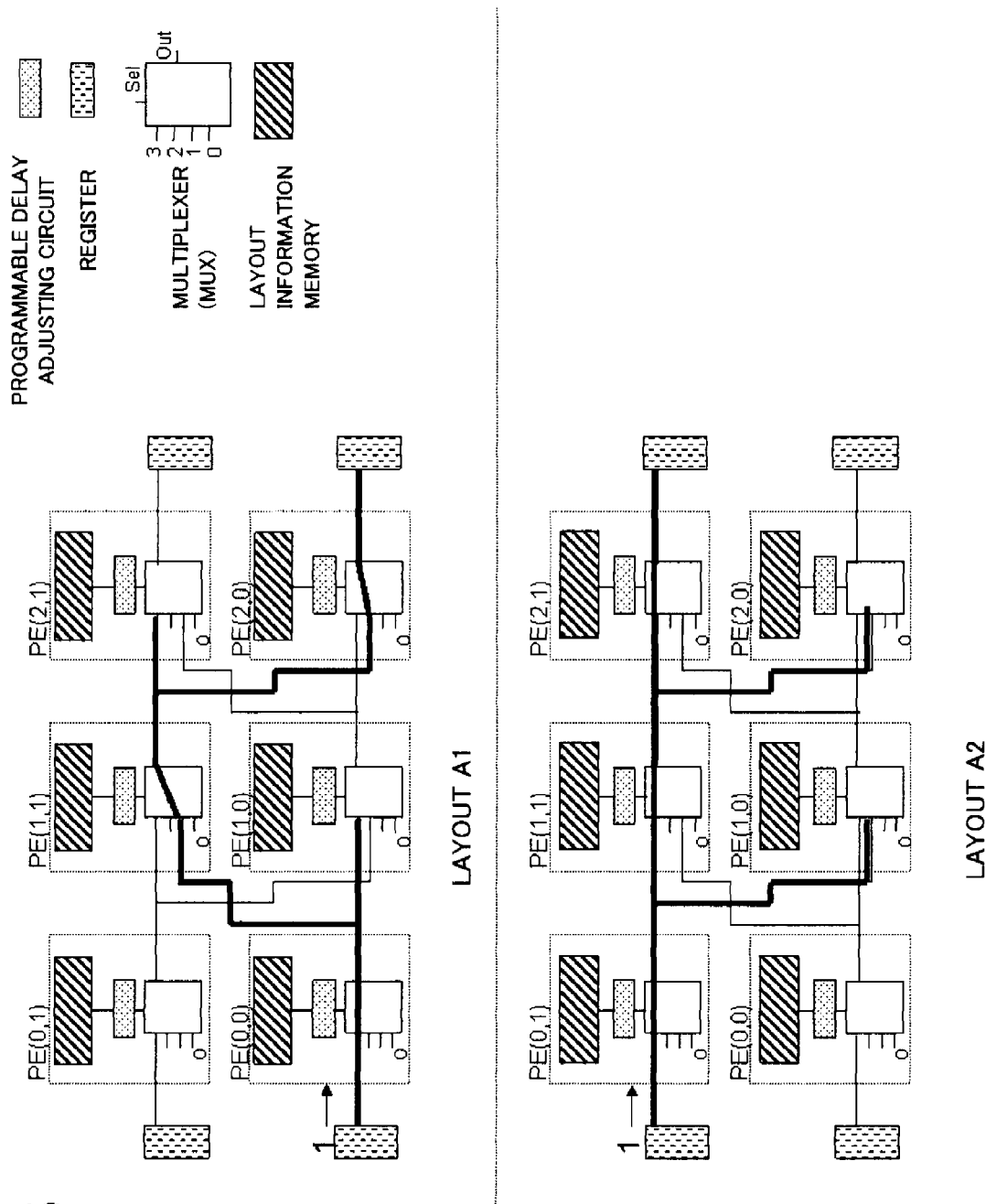
FIG. 5 is a first drawing showing a layout change in the array-type processor relating to the first example of the present invention.
Figure 6:
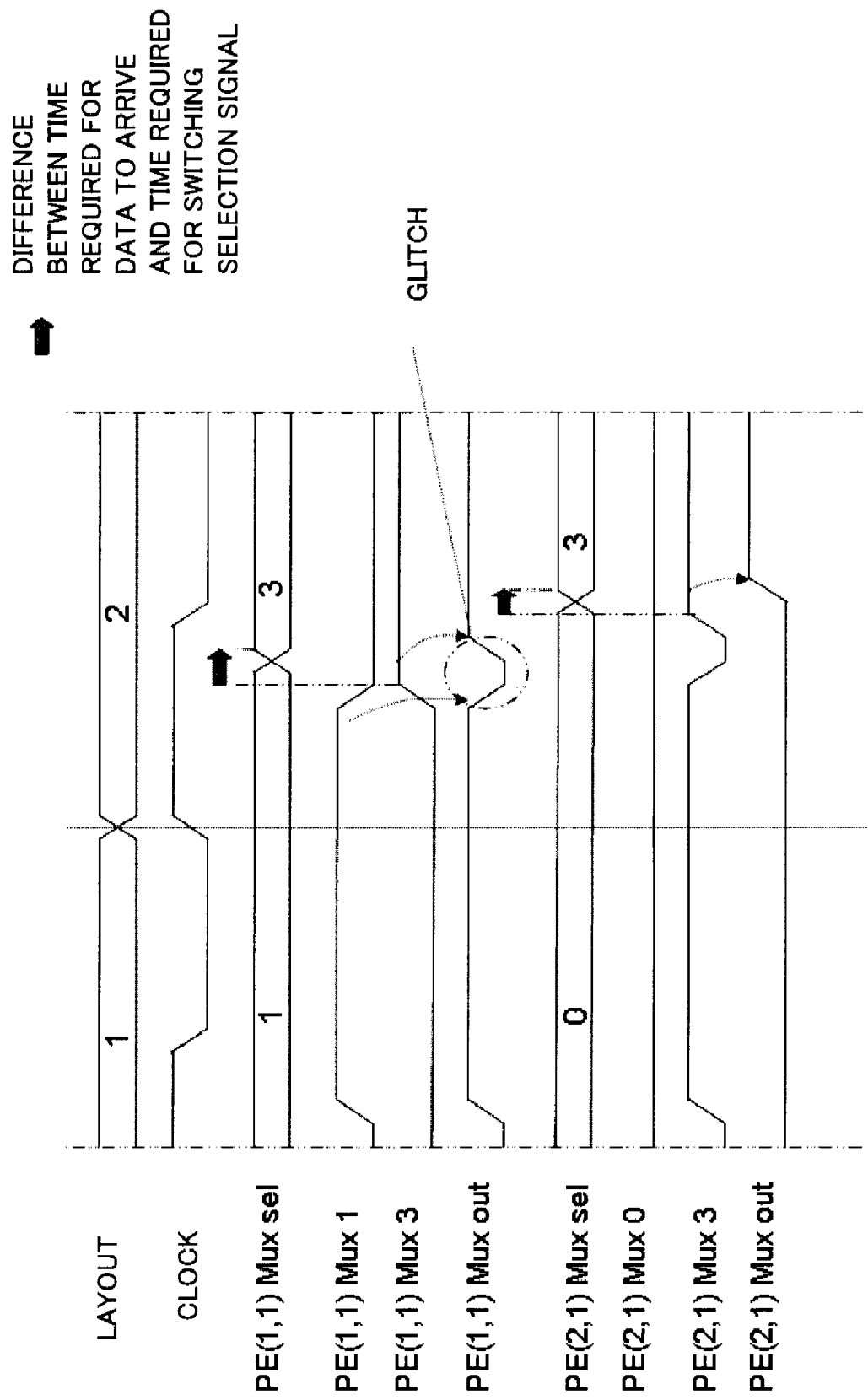
FIG. 6 is a timing chart of each section during the layout change shown in FIG. 5.

When a layout A1 is switched to a layout A2 in FIG. 5, a glitch occurs in the multiplexer belonging to PE (1,1), however, the propagation of the glitch to the multiplexer belonging to PE (2,1) can be suppressed. In other words, in the multiplexer belonging to PE (1,1), a signal change from "1" to "0" at the input port 1 will be reflected to the output port as shown in FIG. 6 even if the delay adjusting circuit in PE (1,1) delays the switching of the selection signal so that it is switched after the data signal arrives from the register. After the selection signal is switched, since the input port 3 in a signal state of "1" is selected, the output port changes from "1" to "0" to "1" and the glitch is reflected to the output port. However, in the multiplexer belonging to PE (2,1), the switching of the selection signal is delayed by the delay adjusting circuit and the input port 0 is fixed to "0" during a period from a rising timing of the clock until the selection signal is switched. Therefore, the output port stays at "0" as well. Then, when the selection signal is switched, the glitch from the output port of the multiplexer belonging to PE (1,1) propagates to the multiplexer belonging to PE (2,1). However, the propagation of the glitch to the output port can be prevented since the delay adjusting circuit operates so that the switch is performed only after the signal state has become stable.

Further, in the example shown in FIG. 5, the arrival of the layout information at the selection signal is delayed by the delay adjusting circuit 12 so that it happens later than the arrival of the data signal at the multiplexer, derived using STA (Static Timing Analysis). In this case, since the selection signal is switched after the data signal has become stable, the propagation of glitches from the wiring switched can be suppressed. However, when the path in question is a critical path (maximum delay path), the delay amount of the critical path increases. Further, when the path has a delay amount close to that of the critical path, the path becomes a critical path due to an increase in delay and the delay may further increase. In these cases, the function of the delay adjusting circuit 12 should not be applied to the critical path or a quasi-critical path, or the selection signal should be switched before but as close as possible to the arrival of the data signal. It is possible to suppress the propagation of glitches and the increase in delay by these adjustments. Further, since the delay adjusting circuit 12 selects the delay amount in a stepwise fashion, there are cases where the switching of the selection signal cannot be delayed later than the arrival of the data signal at the multiplexer. In these cases, a delay time should be selected so that the switching of the selection signal happens as close as possible to the arrival of the data signal, suppressing the propagation of glitches.

As described above, the layout information and the delay adjustment data are related to the layout number. According to the layout number issued by the state transition controller 101, the array-type processor of the present invention changes (conducts a transition of) the circuit configuration (routing) of the data path section using the layout information corresponding to the layout number, and executes an instruction in the data path section. The array-type processor of the present invention is capable of changing (conducting a transition of) the circuit configuration at a timing in which glitches are suppressed using the circuit configuration switching selection signal whose delay amount is adjusted according to the delay adjusting data.

Further, as for the generation of the layout number, the layout information, and the delay adjustment data, for instance, the layout information can be created by dividing the processing of an application program into a plurality of processing tasks according to the operating cycle of the array-type processor when the application program is compiled, determining the layout of the data path section that corresponds to each processing task, and creating an instruction code that matches the layout and the processing task. When the processing of the data path section is divided and the circuit configurations of the data path section are determined, a delay analysis (STA) corresponding to the circuit configuration of the data path section determined as described above has to be taken into consideration since the delay amount of each circuit has to be taken into consideration so that the processing can be performed at the operating clock cycle of the array-type processor as described above. The delay adjustment data can be created using this delay analysis. More concretely, the delay time from the register (sequential circuit) to the selector that changes the circuit configuration in the data processing paths of the data path section in a particular circuit configuration can be derived using STA. Therefore, when the application program is compiled, the delay adjustment data for the particular circuit configuration can be created with a value larger than the derived delay time and related to a layout number.

Example 2

Figure 7:
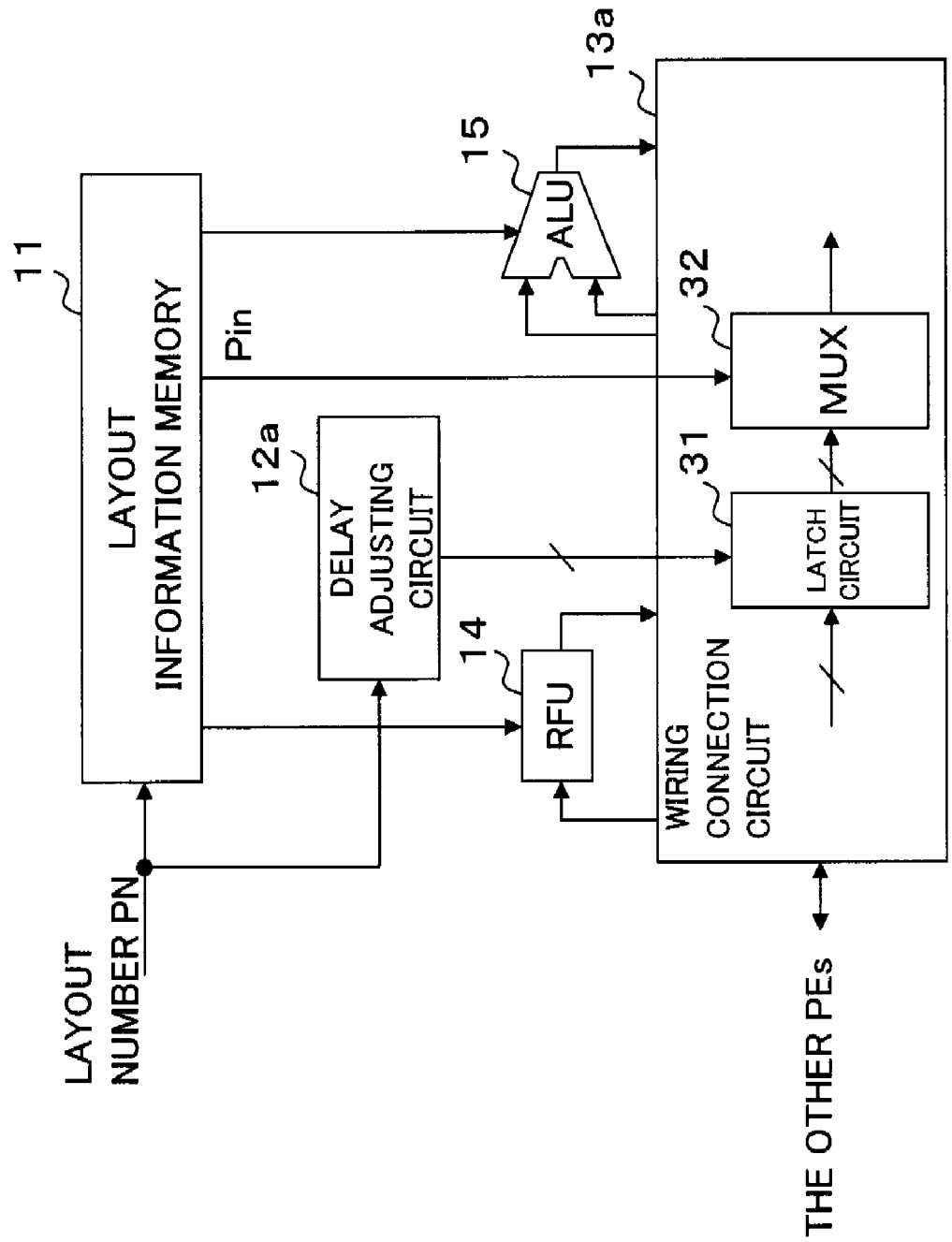
FIG. 7 is a block diagram showing the configuration of a processor element relating to a second example of the present invention.

FIG. 7 is a block diagram showing the configuration of a processor element relating to a second example of the present invention. In FIG. 7, the symbols same as the ones in FIG. 1 indicate the same things, thus the explanations of them will be omitted. The processor element shown in FIG. 7 has a latch circuit 31 added to an input port of a multiplexer 32 in a wiring connection circuit 13*a*, compared with the processor element in the first example, and the latch circuit 31 is controlled by the delay adjusting circuit 12*a*.

Figure 2:
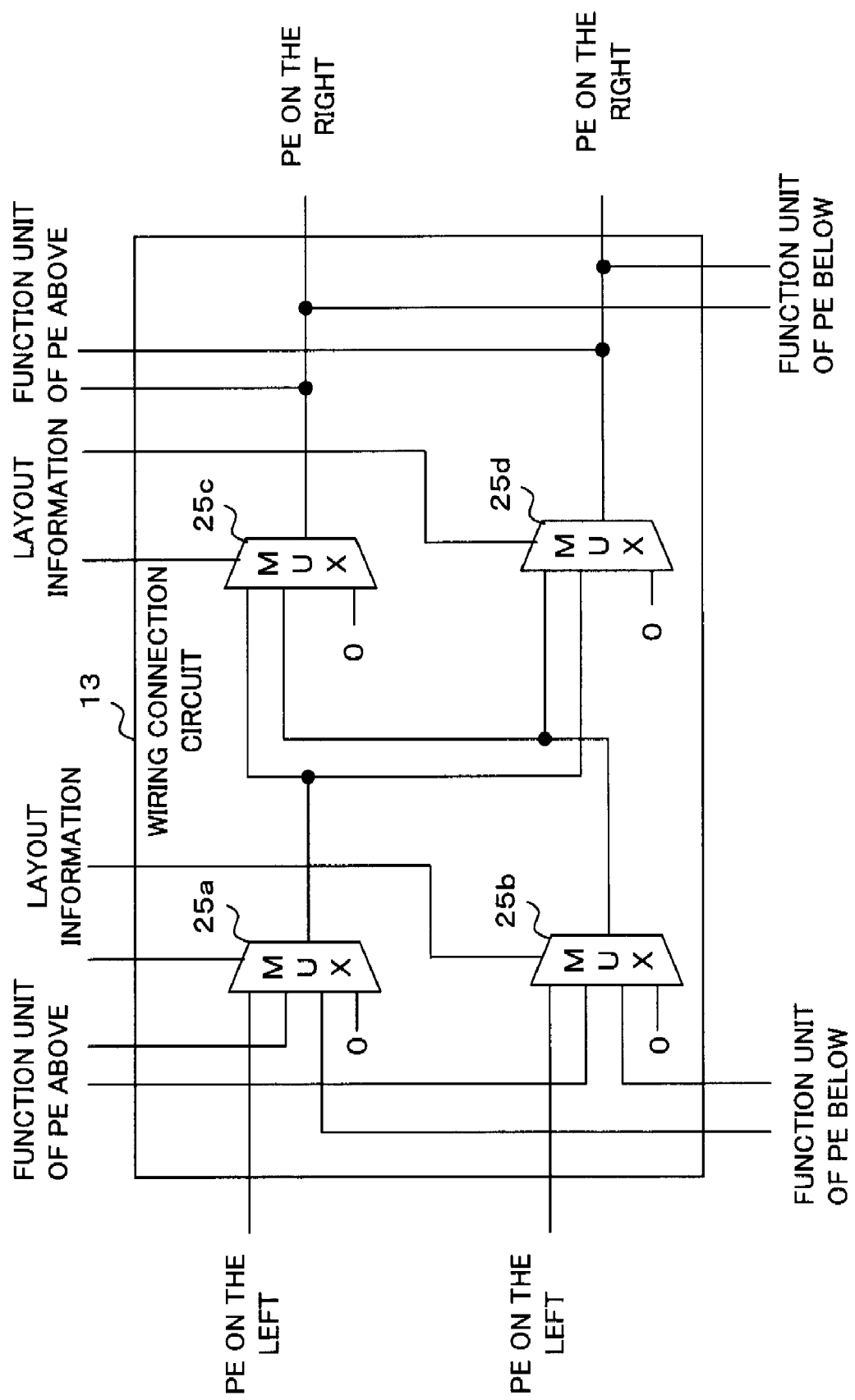
FIG. 2 is a block diagram showing the configuration of a wiring connection circuit relating to the first example of the present invention.

Further, the multiplexer 32 corresponds to the multiplexer 25*a*, 25*b*, 25*c*, and 25*d* in FIG. 2 and only one multiplexer is shown for the sake of simplifying the drawing. Further, the multiplexer 32 selects an output of the latch circuit 31 without delay according to the layout information Pin directly outputted from the layout information memory 11.

Figure 8:
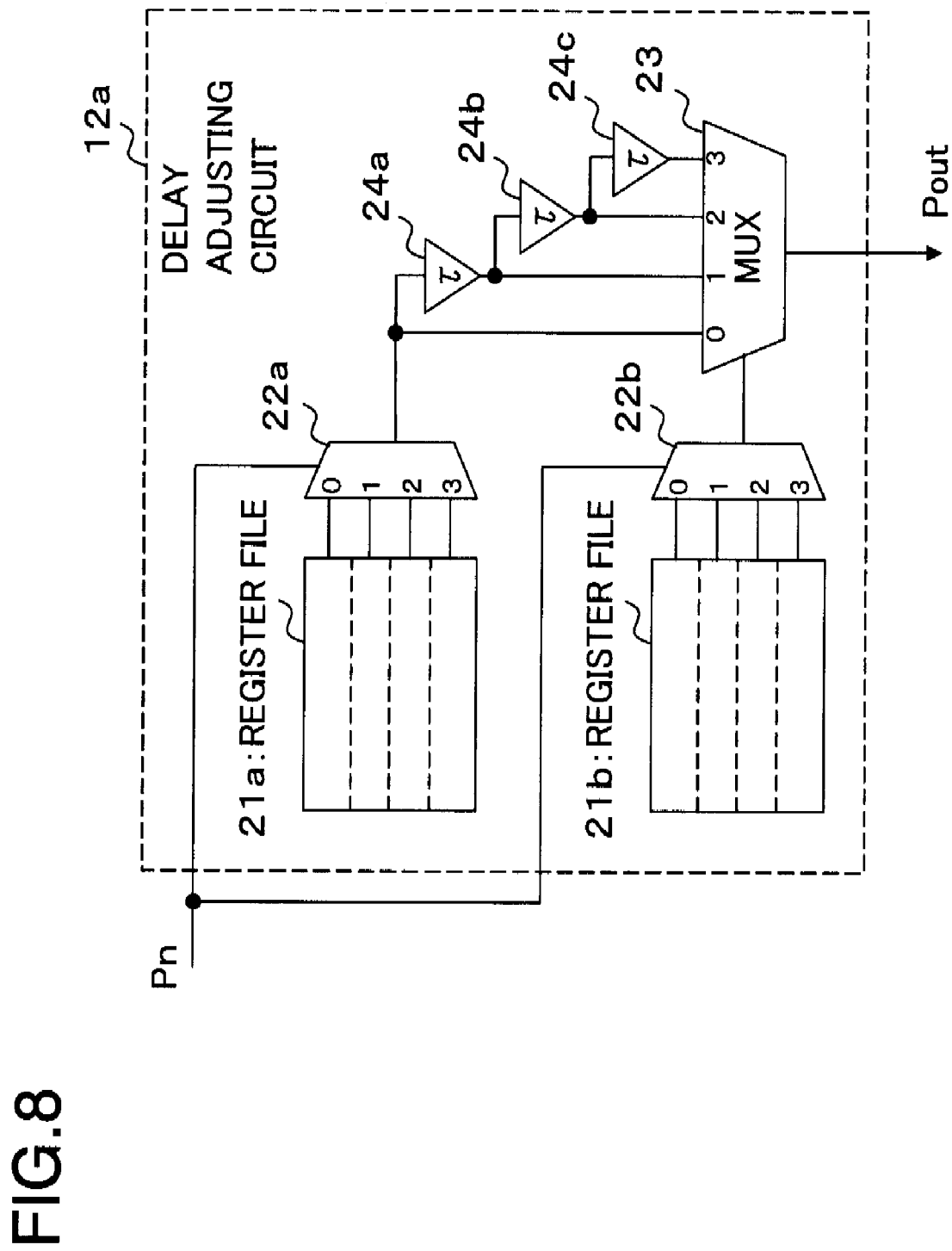
FIG. 8 is a block diagram showing the configuration of a delay adjusting circuit relating to the second example of the present invention.

FIG. 8 is a block diagram showing the configuration of the delay adjusting circuit relating to the second example of the present invention. In FIG. 8, the symbols same as the ones in FIG. 3 indicate the same things, thus the explanations of them will be omitted. The delay adjusting circuit 12*a* comprises two registers: the register file 21*a* for controlling the latch circuit and the register file 21*b* for delay adjustment, multiplexers 22*a*, 22*b*, and 23, and delay elements 24*a*, 24*b*, and 24*c*. In this example, three delay elements are used.

The register file 21*a* stores data for controlling the latch circuit 31 for each path layout and the register file 21*b* stores data for adjusting the delay for each path layout. The state transition controller (corresponding to 101 in FIG. 13) issues the layout number Pn, and the multiplexer 22*a* selects data, for controlling the latch circuit 31, that corresponds to this layout number Pn from the register file 21*a* at the next clock timing. Then the selected data is issued to the multiplexer 23 and the delay element 24*a*. Further, the multiplexer 22*b* selects the delay adjustment data that corresponds to this layout number Pn from the register file 21*b* and issues the selected data to the multiplexer 23. The delay adjusting circuit comprised of the multiplexer 23, the delay elements 24*a*, 24*b*, and 24*c* adjusts the delay of propagation to the latch circuit 31 according to this delay adjustment data and operates so that the control timing of the latch circuit 31 is delayed.

Next, the operation of the array-type processor configured as above will be described in comparison with the first example.

Figure 9:
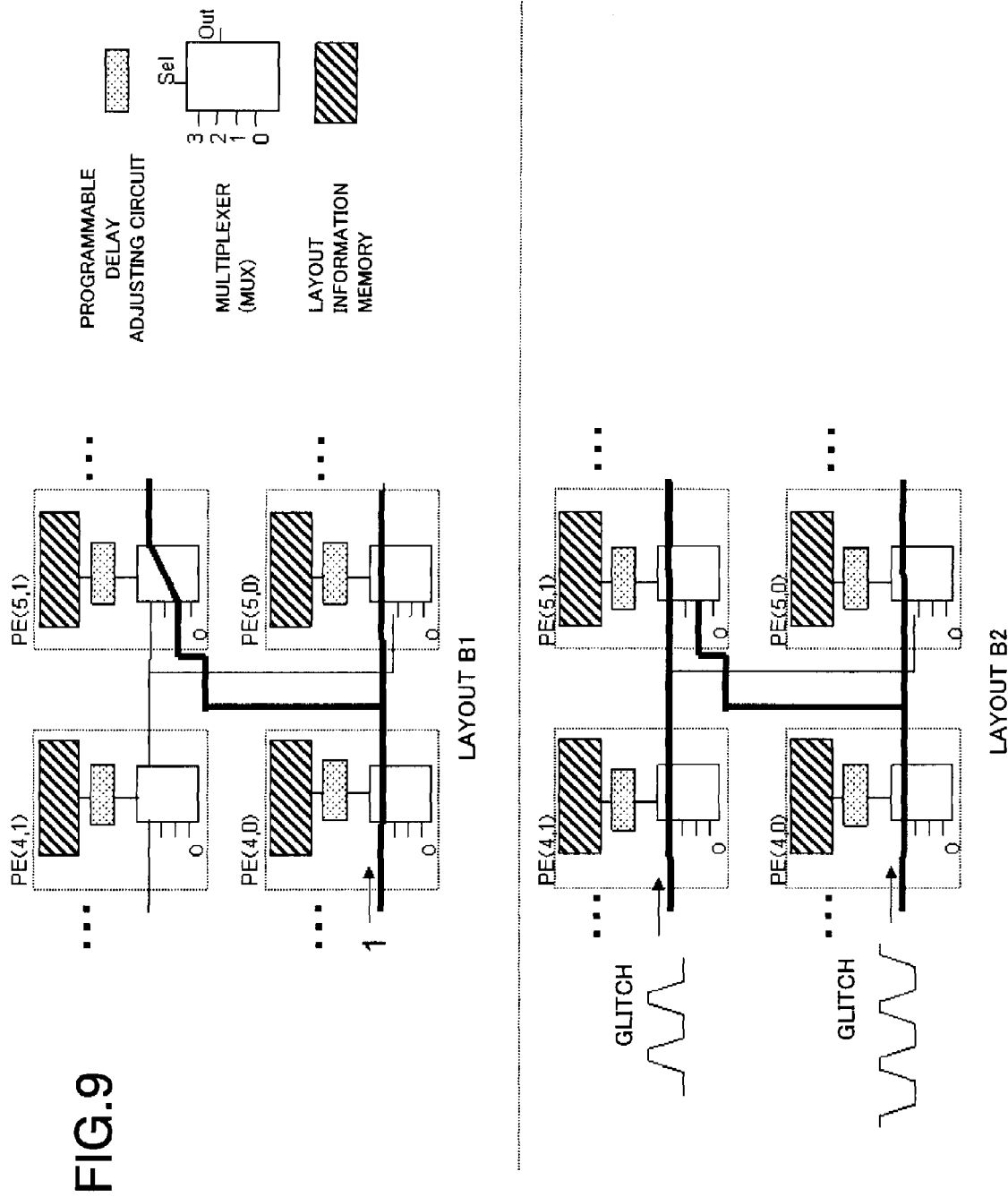
FIG. 9 is a second drawing showing a layout change in the array-type processor relating to the first example of the present invention.
Figure 10:
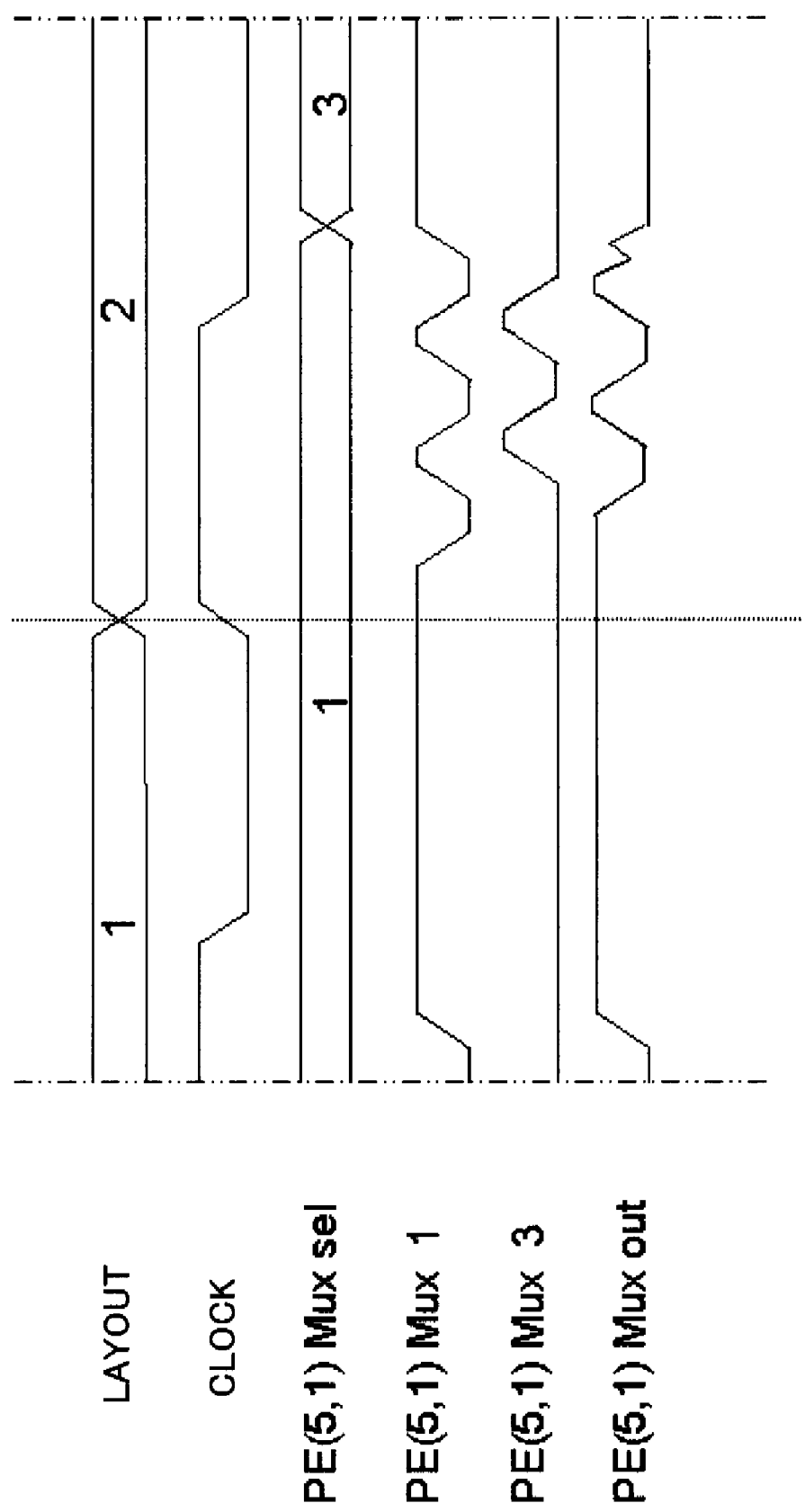
FIG. 10 is a timing chart of each section during the layout change shown in FIG. 9.

FIG. 9 is a drawing showing an example in which a glitch propagates when the wiring connection is switched from the previous layout in the array-type processor of the first example. FIG. 10 shows the operation waveforms at this time. In FIG. 9, the wiring connection is sequentially switched from a layout B1 to a layout B2 per one clock. Further, when the layout B1 is switched to the layout B2, we assume that a plurality of glitches occur in the preceding stage. At this time, the connection of an output port to an input port 1 is switched to an input port 3 in a multiplexer belonging to PE (5,1). As described above, the propagation of the plurality of glitches from the input port 3, to which the selection signal is switched, can be suppressed by having the delay adjusting circuit delay the switching of the selection signal. However, as indicated by "PE (5,1) Mux out" in FIG. 10, the plurality of glitches may propagate from the input port 1, from which the selection signal is switched, by delaying the switching of the selection signal.

Figure 11:
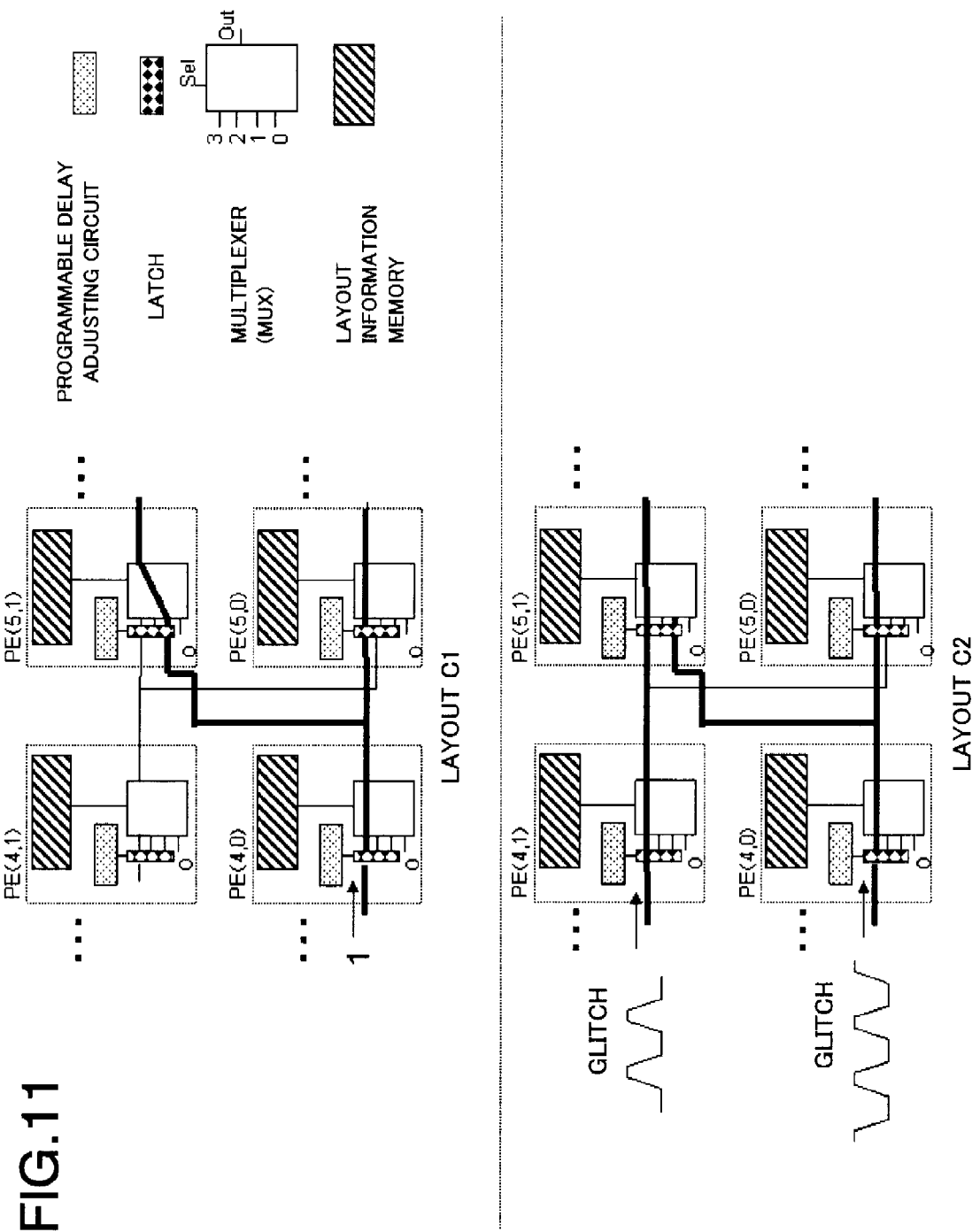
FIG. 11 is a drawing showing a layout change in the array-type processor relating to the second example of the present invention.
Figure 12:
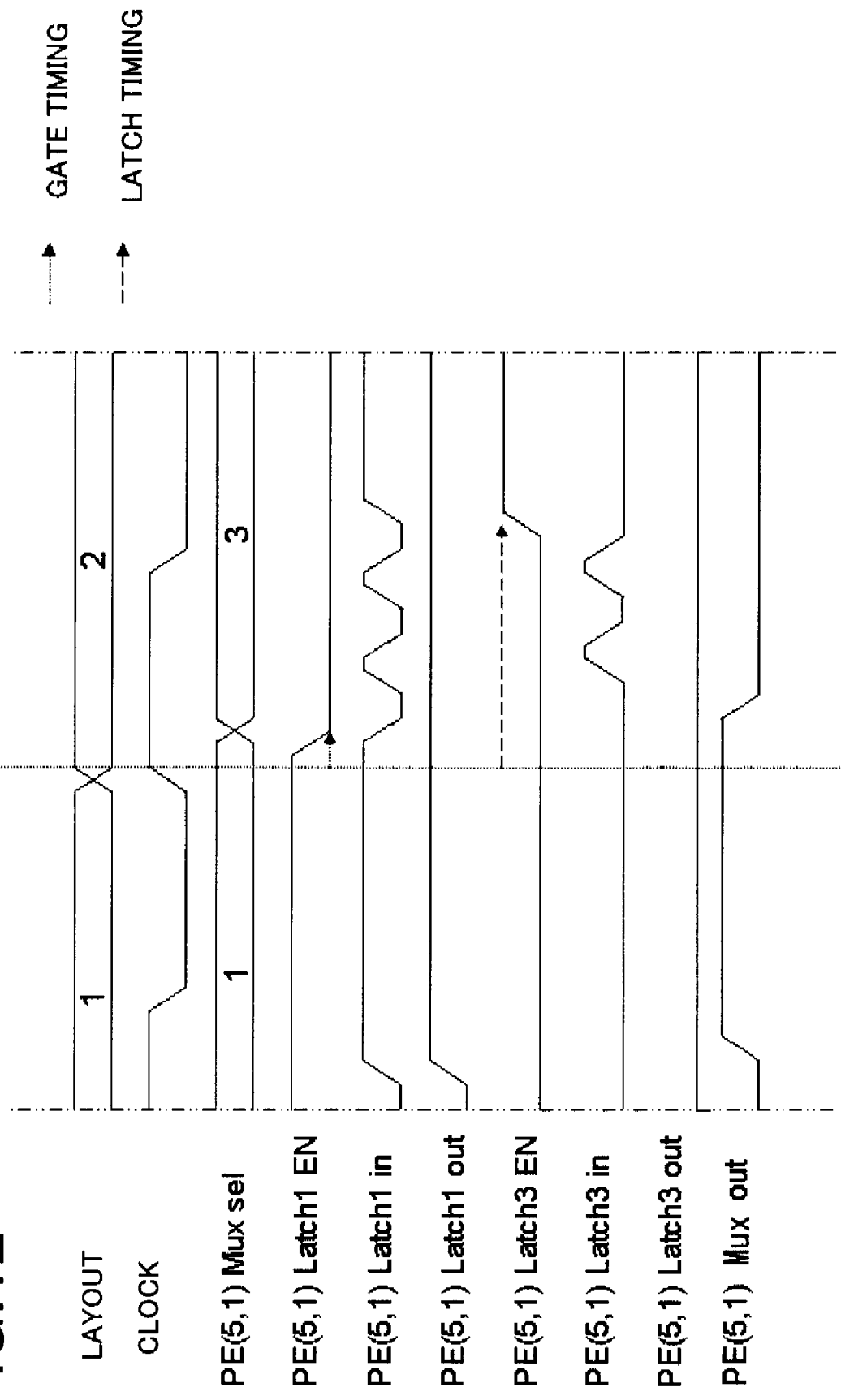
FIG. 12 is a timing chart of each section during the layout change shown in FIG. 11.

Compared with the operation of the first example shown in FIG. 9, a case where the same operation is performed by the second example is shown in FIG. 11. In FIG. 11, when a layout C1 is switched to a layout C2, the connection is switched from the input port 1 to the input port 3 in the multiplexer belonging to PE (5,1). Here, even if the glitches propagate to the input port 1 as indicated by FIG. 12, the propagation of the glitches can be suppressed by having the latch circuit quickly gate the data latched immediately before (refer to "PE (5,1) Latch1 EN" in FIG. 12). Further, even if the glitches propagate to the input port 3, the propagation of the glitches can be similarly suppressed by latching the data at a timing close to when the signal state at the input port 3 becomes stable (refer to "PE (5,1) Latch 3 EN" in FIG. 12). As a result, the glitches will not appear at the output of the multiplexer belonging to PE (5,1).

As indicated by the operation example shown in FIG. 9, when the layout is switched, glitches that have occurred from the wiring connection of the previous layout cannot be suppressed in the first example. However, this kind of glitches can be suppressed by having the latch circuit gate them in the second example.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An array-type processor comprising:
a state transition controller outputting a layout number; and
a plurality of processor elements, wherein each of said plurality of processor elements comprises:
   a memory storing layout information relating to a path layout of data transmission/reception paths between the processor elements, receiving said layout number and outputting a layout information indicating signal based on said layout number;
   a delay adjusting circuit receiving said layout information indicating signal and said layout number and delaying said layout information indicating signal based on said received layout number; and
   a wiring connection circuit receiving said delayed layout information indicating signal and changing one of the data transmission/reception paths at a time of the received delayed layout information indicating signal and based on the received delayed layout information indicating signal.

2. The array-type processor as defined in claim 1, wherein each of said plurality of said processor elements further comprises:
   a function unit configured to perform an operation;
   wherein said delay adjusting circuit is configured to adjust the timing of the changing of the one of the data transmission/reception paths; and
   wherein said wiring connection circuit is configured to change the one of the data transmission/reception paths or connection to said function unit based on said layout information indicating signal outputted from said memory.

3. The array-type processor as defined in claim 2, wherein said delay adjusting circuit comprises:
   a plurality of delay circuits, having delay times different from each other, that delay the layout information indicating signal outputted from said memory;
   a first register group that holds a selection information based on said layout number indicating the path layout to select one of the plurality of delay circuits; and
   a first selection circuit that outputs the delayed layout information indicating signal, whose timing has been adjusted, by selecting one of said plurality of said delay circuits using the selection information to said wiring connection circuit.

4. An array-type processor comprising:
a state transition controller outputting a layout number; and
a plurality of processor elements, wherein each of said plurality of processor elements comprises:
   a memory storing layout information relating to a path layout of data transmission/reception paths between the processor elements, receiving said layout number and outputting a layout information indicating signal based on said layout number;
   a delay adjusting circuit receiving said layout number and delaying an output of a latch permission signal based on said received layout number; and
   a wiring connection circuit receiving said latch permission signal and said layout information indicating signal and changing one of the data transmission/reception paths based on the received latch permission signal and said layout information indicating signal,
wherein said wiring connection circuit comprises:
   a path selection circuit that selects a path to at least one of the other processor elements or to at least one function unit according to the layout information indicating signal outputted from said memory; and
   a plurality of latch circuits that hold a signal of the path to be selected based on said latch permission signal.

5. The array-type processor as defined in claim 4, wherein said delay adjusting circuit comprises:
   a first register group that stores data for selecting one of said plurality of said latch circuits;
   a first selection circuit that selects data in said first register group according to a said layout number indicating a path layout and outputs the data;
   a plurality of delay circuits, having delay times different from each other, that delay the data outputted from said first selection circuit;
   a second register group that stores data for selecting a delay time of said delay circuits;
   a second selection circuit that selects data in said second register group according to said layout number and outputs the data; and
   a third selection circuit that selects one of said plurality of said delay circuits according to the outputted data of said second selection circuit and outputs an output signal of said delay circuit, whose timing has been adjusted, as said latch permission signal.

* * * * *